United States Patent [19]

Shih

[11] 4,129,886
[45] Dec. 12, 1978

[54] DIGITAL REMOTE CONTROL SYSTEM

[75] Inventor: Martin K. S. Shih, Kitchener, Canada

[73] Assignee: Electrohome Limited, Kitchener, Canada

[21] Appl. No.: 662,291

[22] Filed: Mar. 1, 1976

[51] Int. Cl.² ............................................. H04B 1/00
[52] U.S. Cl. .................................. 358/194; 325/391; 325/392; 340/167 A; 343/228
[58] Field of Search ........................ 325/37, 392, 391; 343/228; 178/DIG. 15; 340/147 C, 147 F, 167 A; 358/194

[56] References Cited

U.S. PATENT DOCUMENTS

| | | | |
|---|---|---|---|
| 3,678,392 | 7/1972 | Houghton | 178/DIG. 15 |
| 3,949,297 | 4/1976 | Hideshima | 178/DIG. 15 |

Primary Examiner—Robert L. Griffin
Assistant Examiner—Marc E. Bookbinder
Attorney, Agent, or Firm—Sim & McBurney

[57] ABSTRACT

A method and system for remotely controlling the desired channel and volume selections of a television receiver and other like devices are disclosed herein. The system comprises a transmitter, receiver and information detector, the latter incorporating logic circuitry. The transmitter converts the selection information to ultrasonic signals, and the receiver converts the ultrasonic signals to pulses applicable to logic circuitry. The logic circuitry is adapted to the television receiver so as to apply the selection information to the television receiver and thereby achieve the desired selection.

7 Claims, 26 Drawing Figures

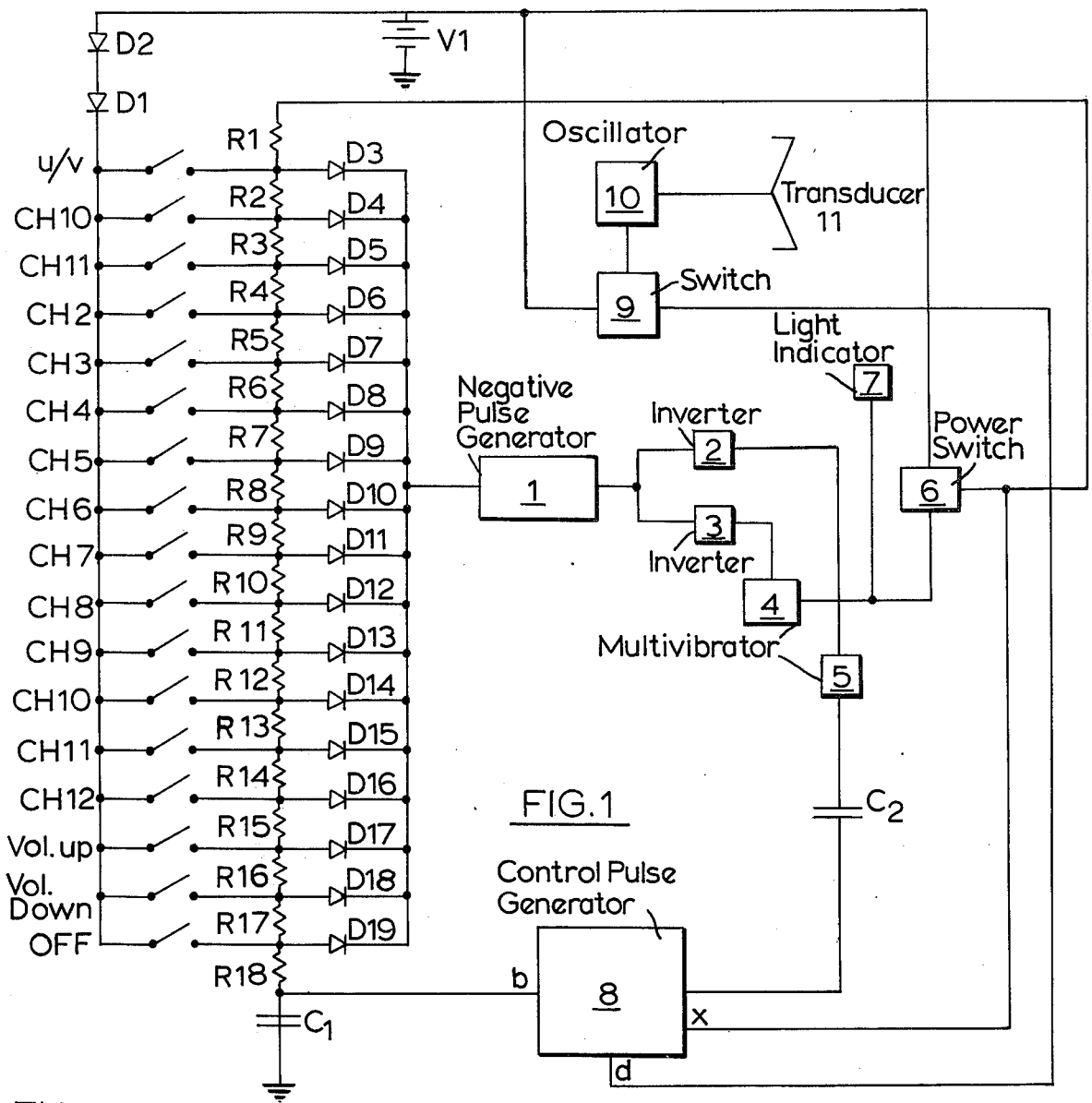
FIG.1
FIG.2
11 ms × 16 (Functions) = 176 ms
 From Power Switch 6
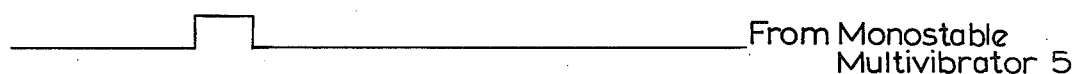 From Monostable Multivibrator 5
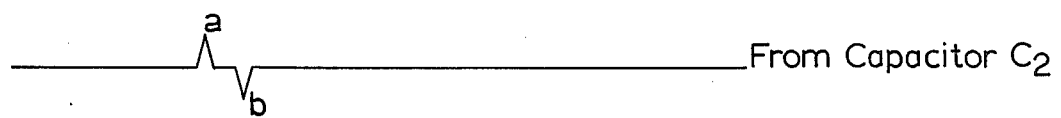 From Capacitor $C_2$
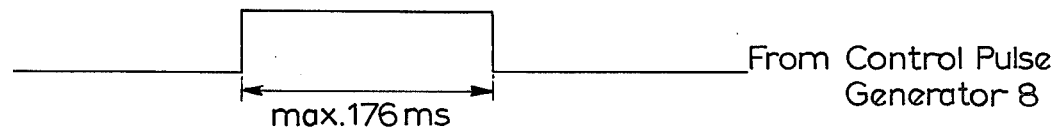 From Control Pulse Generator 8

| Clock No. | D | C | B | A | Function | Group Designation |
|---|---|---|---|---|---|---|
| 16 | 0 | 0 | 0 | 0 | VHF/UHF | Z |
| 1 | 0 | 0 | 0 | 1 | Off Sw. | Y |
| 2 | 0 | 0 | 1 | 0 | Sound Level | X |
| 3 | 0 | 0 | 1 | 1 | | |
| 4 | 0 | 1 | 0 | 0 | | |
| 5 | 0 | 1 | 0 | 1 | | |
| 6 | 0 | 1 | 1 | 0 | | |
| 7 | 0 | 1 | 1 | 1 | | |
| 8 | 1 | 0 | 0 | 0 | On Sw. and 12 Channels | W |
| 9 | 1 | 0 | 0 | 1 | | |
| 10 | 1 | 0 | 1 | 0 | | |
| 11 | 1 | 0 | 1 | 1 | | |
| 12 | 1 | 1 | 0 | 0 | | |
| 13 | 1 | 1 | 0 | 1 | | |
| 14 | 1 | 1 | 1 | 0 | | |
| 15 | 1 | 1 | 1 | 1 | | |

| NOR GATE | | | | NAND GATE | | | |
|---|---|---|---|---|---|---|---|
| | A | B | Output | | A | B | Output |
| | 0 | 0 | 1 | | 0 | 0 | 1 |
| | 0 | 1 | 0 | | 0 | 1 | 1 |
| | 1 | 0 | 0 | | 1 | 0 | 1 |
| | 1 | 1 | 0 | | 1 | 1 | 0 |

$W = \bar{D}\bar{C}$ $X = D + C + \bar{B}$ $Y = \bar{D}\bar{C}B + \bar{D}\bar{C}\bar{A} = \bar{D}\bar{C}(B + \bar{A})$ $Z = D + C + B + A$

DIGITAL REMOTE CONTROL SYSTEM

BACKGROUND OF THE INVENTION

This invention relates in general to a remote control method and system, and in particular, to a remote control method and system for use in association with a television receiver or other tunable signal translating device.

An electronic remote control system for controlling the channel and volume selection of a television receiver is desirable so as to avoid the necessity of the operator's physical presence at the receiver for mechanical selection each time a new selection is desired. Electromagnetic communication systems for remote control are not desirable due to the possibility of interference with the broadcast signal being received by the television receiver. For this reason, remote control devices will normally utilize sonic signals. For the purpose of avoiding any discomfort to the operator and other viewers, the sonic signals may be ultrasonic.

One known remote control system utilizes sonic signals of varying sonic frequencies to transmit the selection to the television receiver. This type of remote control system requires an amplifier to operate over a range of frequencies, and therefore, uses more power than would be necessary if the transmitter could operate at a single, efficient frequency. Likewise, known remote control systems require the selection changes in the television receiver to be in sequence. It is desirable to have a system which permits selection in random order.

SUMMARY OF THE INVENTION

In accordance with one aspect of this invention there is provided, in combination, signal receiving equipment adapted to receive and translate broadcast signals, the signal receiving equipment including information receiving and detecting means, the signal receiving equipment being operable in a plurality of different modes; a transmitter remotely located with respect to the signal rceiving equipment, the transmitter including means for generating pulses having different discrete pulse widths, a leading edge and a trailing edge, each pulse width corresponding to a different desired mode of operation of the signal receiving equipment, and means for transmitting the pulses; the information receiving and detecting means comprising means for receiving and detecting the pulses, trailing edge noise eliminating means and means for applying the received and detected pulses to the trailing edge noise eliminating means for eliminating noise pulses that may follow the trailing edges of the received and detected pulses; and means for controlling the mode of operation of the signal receiving equipment comprising means responsive to the detection of pulses having different discrete pulse width for automatically changing the mode of operation of the signal receiving equipment to modes of operation that are predetermined by the width of the pulses detected by the detecting means.

One feature of a preferred embodiment of the system is that the transmitting means operates at a single, preferably ultrasonic frequency. In known remote control systems the transmitting means utilizes different frequencies for different selection information as indicated above. Such a system would require more transducers or a wide range amplifier. The present invention may utilize a single transducer operating at its most efficient frequency and is therefore more efficient and less complex. Likewise, the receiving means of the present invention need only be tuned to receive a single frequency and is also more efficient and less complex than receiving means capable of receiving signals of various different frequencies.

Another feature of an aspect of this invention is that the information detection means can comprise logic circuitry that permits the selection information to be directly transferred to the broadcast signal receiver, thereby permitting random access to the various channels to which the receiver can be tuned, as opposed to the currently known systems which require sequential change.

BRIEF DESCRIPTION OF THE DRAWINGS

The features of the present invention which are believed to be novel are set forth with particularity in the claims. The invention is best understood by reference to the following description, taken in conjunction with the accompanying drawings in which like reference numerals indentify like elements, and in which:

FIG. 1 is a block diagram and schematic of transmitting means for use in association with the remote control system of this invention;

FIG. 2 is a waveform diagram useful for understanding the operation of the transmitting means;

DESCRIPTION OF THE PREFERRED EMBODIMENT

Figure 3:
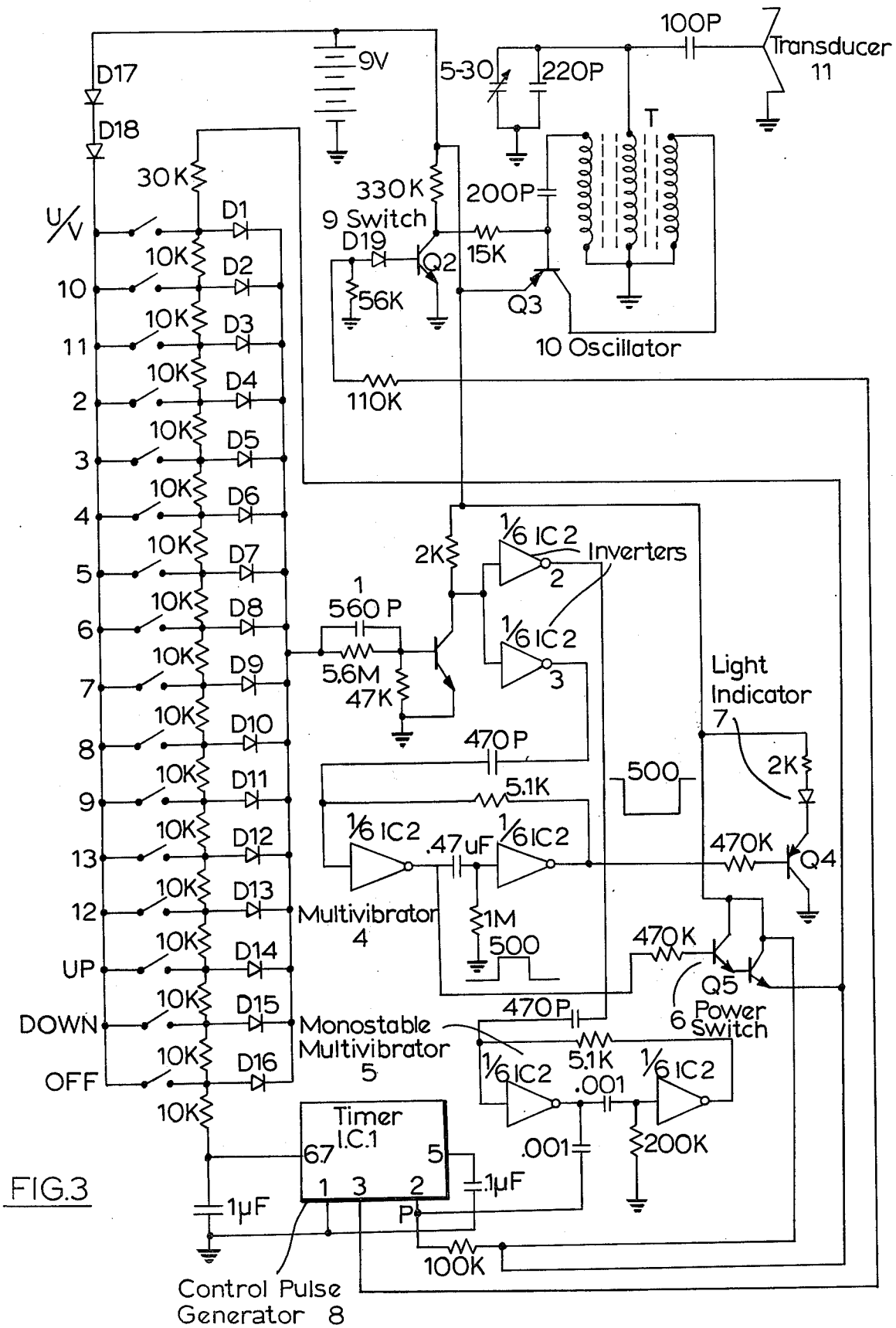
FIG. 3 is a detailed schematic diagram of the preferred transmitting means of FIG. 1.

For the purpose of describing the present invention reference will be made to a television receiver, although it will be understood that the invention lies in a remote control system and method which may be applied to tunable receivers other than television receivers.

The invention will be described in three basic parts, namely the transmitting means, the receiving means, and the information detection means.

TRANSMITTING MEANS

In accordance with this aspect of the invention, the transmitting means is adapted to transmit the selection information at a single, preferably ultrasonic, frequency. Referring now to FIG. 1, the transmitting means comprises sixteen selection switches namely, UHF, VHF, channels 1 to 12 inclusive, volume up, volume down, and off. The selection switches are connected to diodes D3 to D19 respectively. Resistors R2 and R17 are connected as shown between adjacent pairs of switches. A resistor R18 and a capacitor C1 are series connected between the off switch and ground, while a resistor R1 is connected to the UHF/VHF switch. A DC power supply V1 is connected to the sixteen selection switches by diodes D2 and D1 such that when one of the selection switches is closed, for example CH6, a circuit is completed comprising diodes D2 and D1 resistors R9 to R18 inclusive and capacitor C1 to ground.

Diodes D3 to D19 inclusive are all connected to a negative pulse generator 1 which in turn is connected to inverters 2 and 3. Inverter 2 is connected to a multivibrator 5. Multivibrator 5 in turn is connected to a control pulse generator 8 through a capacitor C2. Inverter 3 is connected to a multivibrator 4 which in turn is connected to a light indicator 7 as well as a power switch 6. Power switch 6 is connected to control pulse generator 8, while the output of control pulse generator 8 is connected to a switch 9 which acts as a switch for an oscillator 10. The output of oscillator 10 is transmitted by means of a conventional transducer 11.

So that the system will be functional when selection information is desired to be transmitted, the power supply V1 is connected to switch 9 and power switch 6 at all times. To complete the circuitry there is a connection between control pulse generator 8 and the junction of resistor R18 and capacitor C1, and power switch 6 is connected to resistor R1 thereby providing for the desired voltage bias to Control Pulse Generator 8.

When a selection switch is closed, for example switch CH6, current passes from power supply VI through diodes D2, D1, and D10 into negative pulse generator 1. A negative pulse is derived at the output of generator 1 and is applied to inverters 2 and 3. The outputs of inverters 2 and 3 trigger monostable multivibrators 4 and 5. Multivibrator 4 is set to produce a pulse of relatively long duration, for example 500 ms. This pulse is applied to power switch 6, closing the switch and thereby providing control pulse generator 8 with power for the 500 ms. time period. The output pulse of multivibrator 4 may also be applied to light indicator 7 which remains on for the same period of 500 ms. indicating to the operator the period of time during which power is applied to control pulse generator 8.

Monostable multivibrator 5 is set to have a shorter time period pulse output of approximately 1 ms. From FIG. 2 one may see the relationship of the output signal of monostable multivibrator 5 and power switch 6. The output signal of monostable multivibrator 5 is differentiated by capacitor C2 and the trailing edge b (FIG. 2) of the differentiated signal triggers control pulse generator 8. The output of control pulse generator 8 therefore will lag behind the change in state of power switch 6, since generator 8 is triggered after power has been applied to the control pulse generator 8 from power switch 6. It may also be seen from FIG. 2 that control pulse generator 8 is designed to operate for a period less than the time during which power is applied thereto from power switch 6. Thus there will be power applied to control pulse generator 8 before the control pulse generator 8 is triggered into operation and for a period of time longer than its period of operation.

Control pulse generator 8 generates a single pulse which has a width determined by the time constant of capacitor C1 and the resistances in the circuit therewith, the number of these resistances depending upon which switch is closed. Suppose, for example, CH6 was closed. In this case the resistances in circuit can be seen from FIG. 1 to be R9 through to R18. The values of the various resistances are chosen so that the time during which control pulse generator 8 operates will always be less than the time during which power is supplied from power supply VI to generator B via switch 6. A range from 11 ms. to 176 ms has been found to be a convenient operating range for control pulse generator 8.

It can be seen that until a particular selection switch is closed, no power is applied to control pulse generator 8, and, therefore, the system is normally in the off state. In addition, regardless of how long a selection switch is closed by the operator, multivibrator 4 will produce an output signal for a fixed period of time of approximately 500ms., and thereafter power supplied to generator 8 via power switch 6 will be interrupted automatically. Such a system not only conserves power from power supply VI, but also eliminates the necessity of having a manually operated, on-off power switch for the transmitting means, which power switch might inadvertently be left on by the operator, thereby running down the power supply. In addition, more flexibility exists in designing the transmitting means, since only a small DC power supply is required, and this conveniently can be a battery.

From FIG. 1 it can be seen that the output from control pulse generator 8 at output terminal d thereof is applied to switch 9. Switch 9 controls oscillator 10 which is tuned to operate at its resonant ultrasonic frequency. When the selection switches are open, oscillator 10 is cutoff, and it will only operate during the period of time when a control pulse from generator 8 actuates switch 9 to turn on oscillator 10. It can therefore be seen that there is radiated from transducer 11 pulse bursts, the width of each burst being determined by which one of the selection switches was closed and the carrier frequency of the pulses in the bursts being the frequency of the output signal of oscillator 10.

FIG. 3 illustrates in more detail possible components for the items shown in block form in FIG. 1. Other components and circuitry could also be used to achieve the desired results.

RECEIVING MEANS

Figure 4:
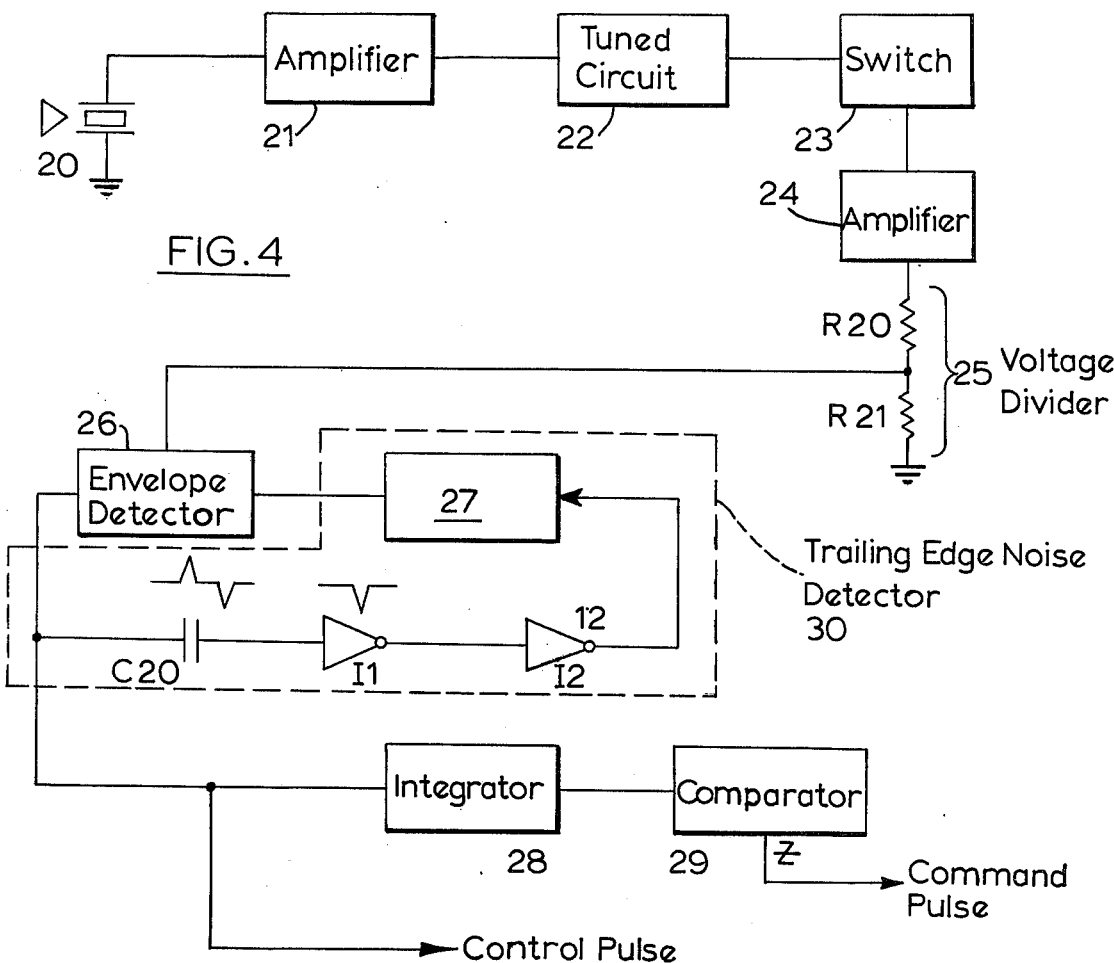
FIG. 4 is a block diagram of the receiving means embodying this invention.

A block diagram of the receiving means is shown in FIG. 4. The transmitted selection information signal is received by a conventional microphone 20 and is amplified by amplifier 21. The amplified received signal is applied to a tuned circuit 22 which is tuned to the carrier frequency of the transmitting means and thus acts as a filter allowing only received signals having the same frequency as that of the tuned circuit to pass. It can be seen that if the system were not operating at a single frequency, it would be necessary to have a number of tuned circuits 22 to act as filters for the various frequencies being used. Such a requirement would increase the complexity of the system and reduce the flexibility and efficiency of the receiving means.

The received signal then is applied to a switch 23 which permits only the positive portion of the received signal to pass. The positive portion is further amplified by the amplifier 24 and divided by a voltage divider 25. The purpose of the voltage divider 25 is to obtain a signal of approximately 5 volts, which is a desired voltage to be applied to the logic circuitry of the detection means. The positive portion of the received signal is applied to an envelope detector 26 where the high frequency carrier frequency is removed, leaving the envelope of the carrier signal, this being the control pulse.

In addition to the control pulse derived from envelope detector 26, it is desirable to obtain another pulse which will be referred to as the command pulse. To obtain the desired command pulse the output of detector 26 is applied to an integrator 28, the output of which is applied to a comparator 29. The command pulse is the output of comparator 29. This aspect of the system will be dealt with in greater detail hereafter.

Figure 5:
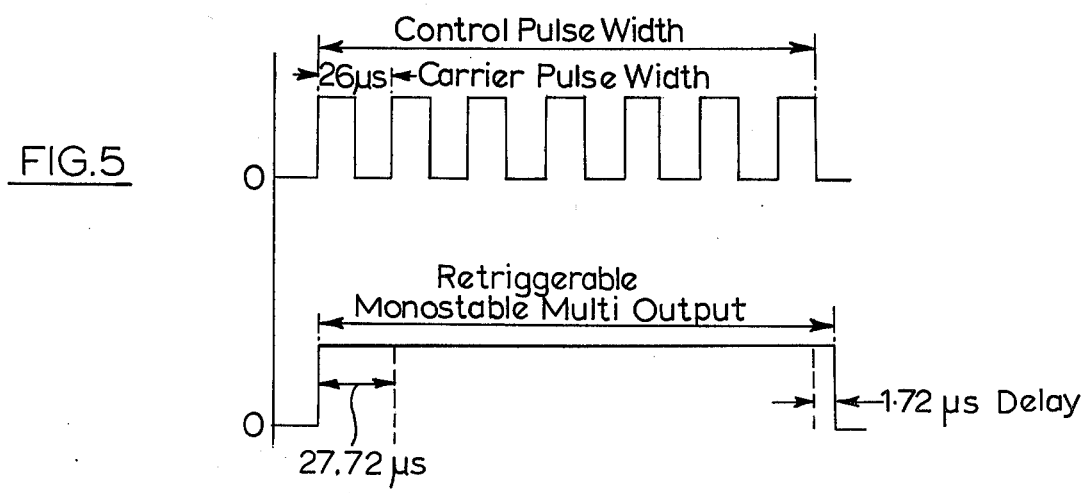
FIG. 5 is a waveform diagram useful for understanding the operation of the envelope detector of the receiving means.
Figure 8:
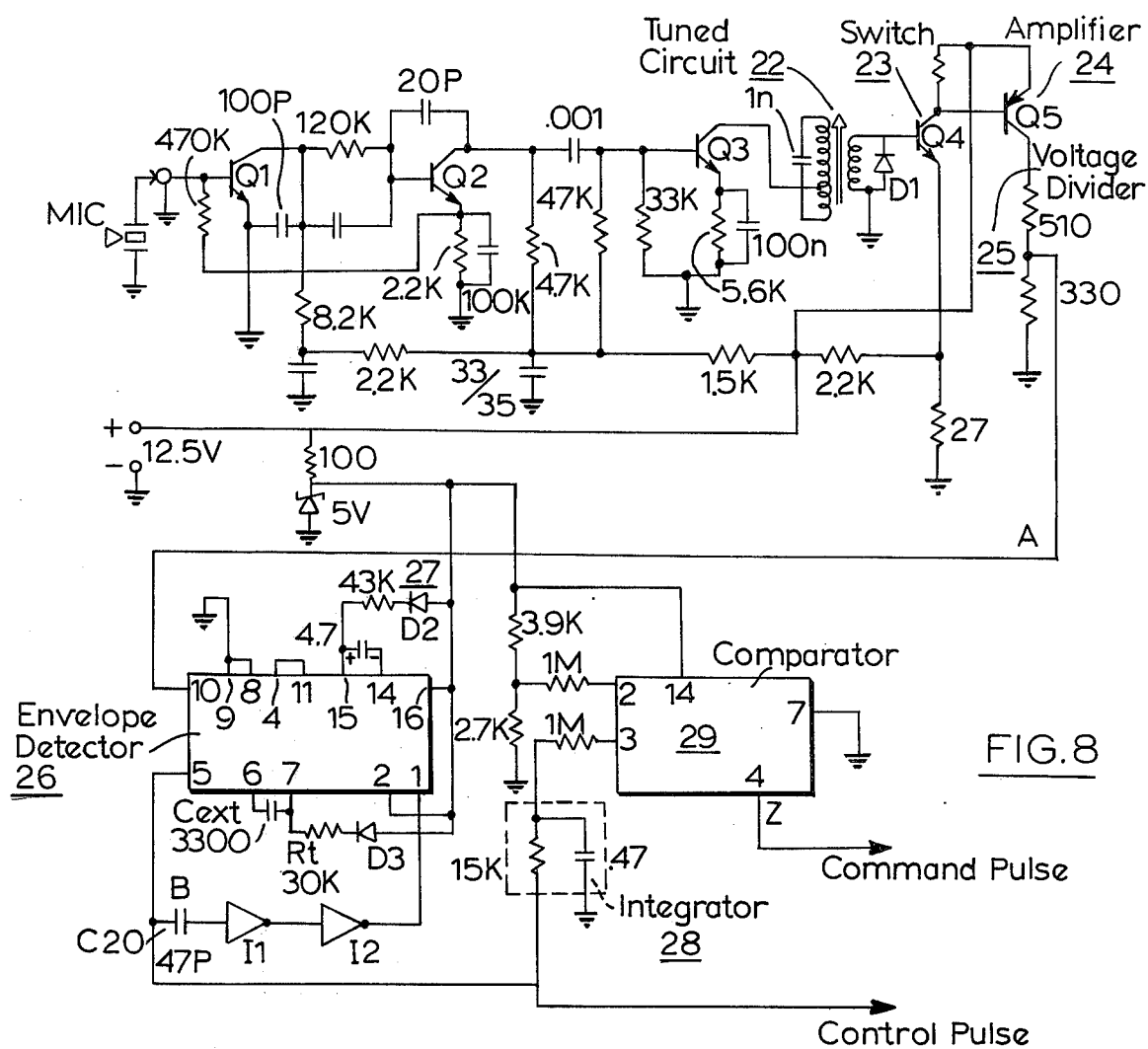
FIG. 8 is a schematic diagram with suggested component values of receiving means embodying the invention.

Envelope detector 26 is a retriggerable, monostable multivibrator as shown in FIG. 8. It will be appreciated that the time period of the multivibrator may be greater than that for one cycle of the carrier frequency signal. There may therefore be a cutoff delay, and the output of the retriggerable monostable multivibrator will be larger than the control pulse by the amount of the delay. For example, if the carrier wave has a frequency of 38.5 KHZ, it has a time period of 26 microseconds, as shown in FIG. 5. The time period of the multivibrator is given by the formula:

$$Tw = 0.28 \, Rt \, Cext \left(1 + \frac{0.7}{Rt}\right)$$

$Rt$ = kohm, $Cext$ is in pf, $Tw$ is in Ns.

If Rt equals 30 Kohm's and Cext equals 3300 pf, Tw equals 27.72 microseconds. The total delay time will therefore be 27.72 microseconds minus 26 microseconds, or 1.72 microseconds. Hence a pulse is derived from envelope detector 26 which has a pulse width 1.72 microseconds longer than the control pulse. This 1.72 microsecond delay will always be the same and since a control pulse having a width in the range of approximately 11 ms. to 176 ms. is being dealt with, a delay of 1.72 microseconds does not cause difficulties.

Noise pulses have been found to occur at the trailing edge of the received signal. These may be caused by the characteristics of the transducer 11 (FIG. 1) of the transmitting means, microphone 20 (FIG. 4) of the receiving means, amplifier 21 (FIG. 4) of the receiving means, the ringing effect of the tuned circuit 22 (FIG. 4) and of the receiving means, and by reflections of the ultrasonic carrier frequency during transmission.

Figure 6:
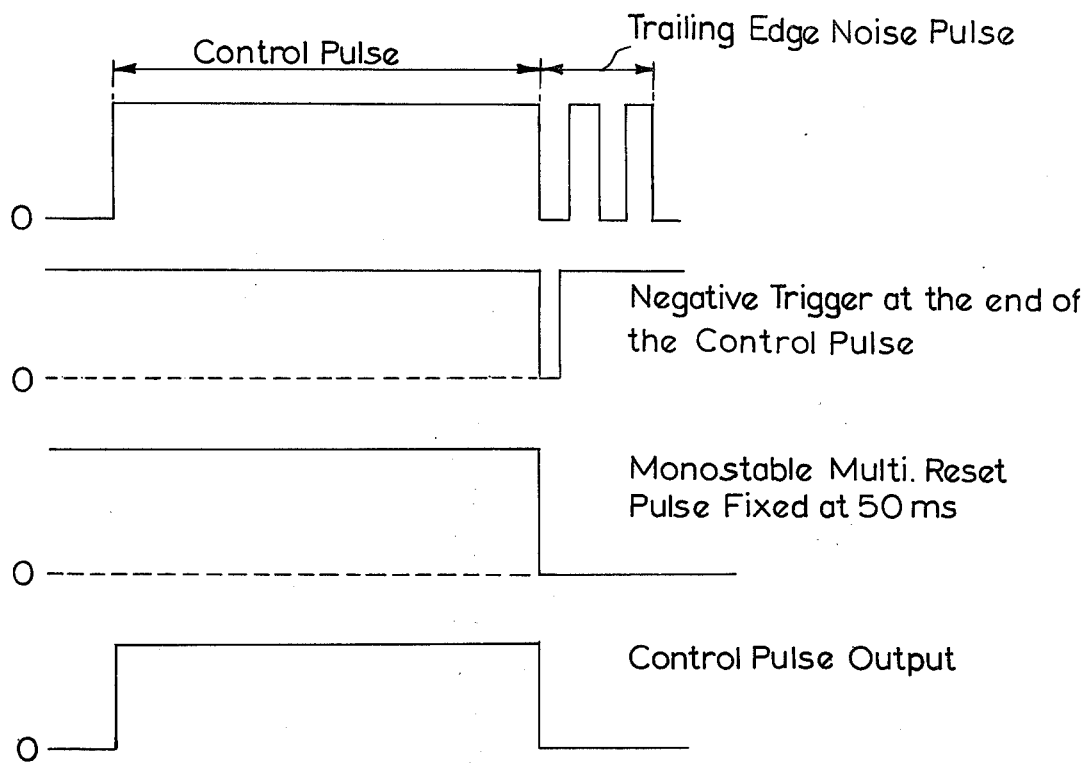
FIGS. 6 and 7 are waveform diagrams useful for understanding the operation of components of this invention.

FIG. 6 shows the waveform of the control pulse envelope of the received signal with trailing edge noise pulses. One means of eliminating the undersirable trailing edge noise is shown in FIG. 4 as a trailing edge noise detector 30 comprising a differentiating capacitor C20, two inverters I1 and I2 and a monostable multivibrator 27. The output of detector 26 is differentiated and the differentiated signal then is applied to inverters I1 and then inverter I2 which are arranged so that the output at terminal 12 is a negative pulse occurring at the trailing edge of the control pulse envelope. This negative pulse is used to trigger monostable multivibrator 27. In logic terms, the output of multivibrator 27 is at the one state when static. When multivibrator 27 is triggered, the output thereof goes to the zero state for its operating time period, thereby cutting off envelope detector 26 for that time period. The time period of multivibrator 27 may be approximately 50 ms., so that once multivibrator 27 is triggered, envelope detector 26 remains off for a period of approximately 50 ms. and any trailing noise pulses will be eliminated at the trailing edge of the control pulse. Representative values for components of the trailing edge noise 30 detector of FIG. 4 are shown in FIG. 8.

Figure 7:
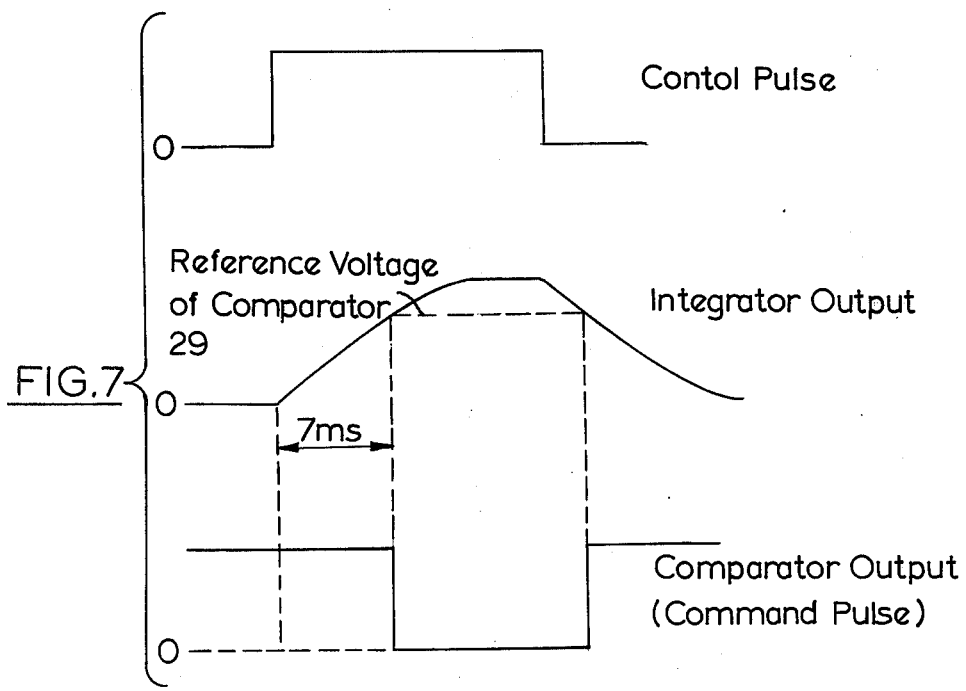

In addition to the trailing edge noise, there may be ultrasonic noise picked up by the receiving means resulting from a telephone ringing, coins dropping, etc. This noise could trigger the detection means and result in an undesirable selection. Since this noise is of an irregular character and not a continuous pulse, as is the received signal, this difference in characteristic may be used as a means for controlling the undesirable ultrasonic noise. A preferred means of achieving this control is shown in FIG. 4 utilizing an integrator 28 and a comparator 29 to obtain a command pulse which may be used to trigger the detection means. Integrator 28 may have a time constant of approximately 7 ms. Comparator 29 may be provided with a reference voltage of approximately 3 volts. Referring to FIG. 7, the waveform of the output signal of integrator 28 is compared against the reference voltage by comparator 29. When the output voltage of integrator 28 which is applied to comparator 29 reaches the reference voltage of comparator 29, there is an output signal from comparator 29 derived at output terminal Z in FIG. 4. Comparator 29 will continue to provide an output signal until such time as the voltage from integrator 28 again drops below the reference voltage of comparator 29, all as shown in FIG. 7.

Undesired signals such as the ringing of a telephone will be constituted by short, irregular pulses. Integrator 28 is designed to delay the build-up of the voltage to the reference voltage of comparator 29 for approximately 7 ms as seen in FIG. 7. Since an individual pulse of the undesirable noise normally will have a time period of less than 7 ms., the voltage output of the integrator 28 due to undesired signals will not reach the reference voltage of comparator 29 and there will therefore not be an output from comparator 29.

Comparator 29 is set such that its static state is the one state and its operating state is zero. The result at output terminal Z of FIG. 4 is a negative pulse which trails the control pulse, as shown in FIG. 7. This pulse at output terminal Z is the command pulse for the detection means. It can be seen that although undesirable signals may pass through envelope detector 26 and proceed to the detection means as a control pulse, no such undesirable signals will be present in the command pulse.

As will be seen from the subsequent description of the detection means, the detection means will not operate until such time as a command pulse is received, and hence the effects of ultrasonic noises are eliminated.

The schematic diagram of FIG. 8 illustrates in more detail components that might be used in the various blocks of FIG. 4. Suggested values for the various devices and components in FIG. 8 are also given, but it will be appreciated that these values and components are merely illustrations of a means of achieving the desired operation.

Figure 9:
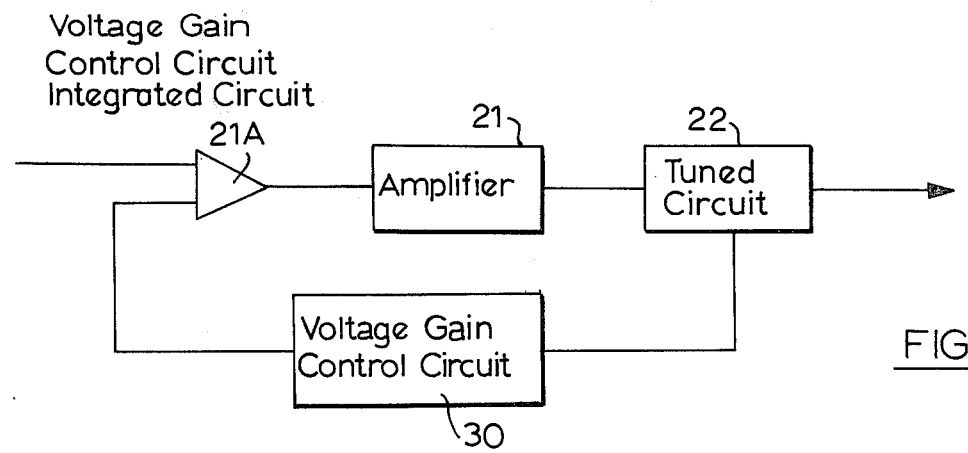
FIG. 9 is a block diagram of an automatic gain control circuit which may be incorporated into the receiving means.

The location of the transmitting means in relation to the receiving means may cause undesirable effects when ultrasonic signals are being used. For example, if an object is between the transmitting means and the receiving means or if the distance separating the two is great, the received signal would be weaker than normal operation. If the receiving means were set to maximum amplification at all times so as to detect the weak signal distortion and undesirable selection could result if a fairly strong signal were received. An improvement in this respect may be achieved by using an automatic gain control system. FIG. 9 is an automatic gain control circuit which may be incorporated into the receiving means. The AGC circuit consists of a voltage gain control circuit 30 connected between tuned circuit 22 and a voltage gain control integrated circuit 21A so as to permit feedback from tuned circuit 22 through voltage gain control circuit 30 to the input to amplifier 21 via voltage gain control integrated circuit 21A. The system is designed to give maximum gain while waiting for a received signal and to provide gain control as desired. For example, if a weak signal is received, maximum gain will result and the voltage gain control circuit 30 will not reduce the amplification of the received signal. If a strong signal is received, the amplification or gain will be reduced as a result of the operation of the voltage gain control circuit 30.

Figure 10:
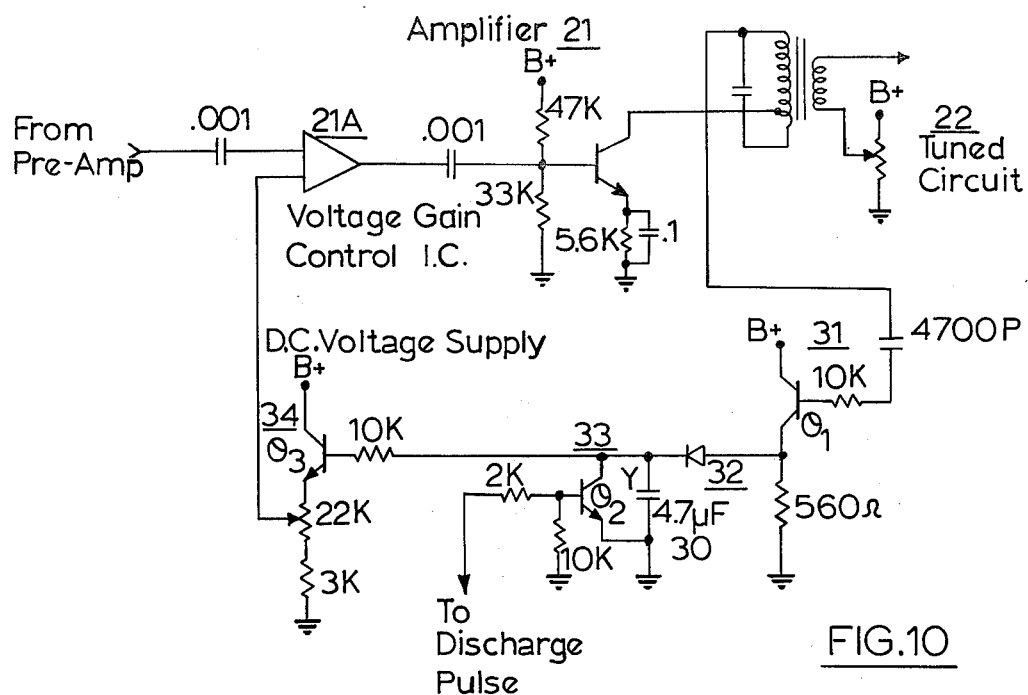
FIG. 10 is a schematic diagram with suggested component values of the circuit of FIG. 9.

In FIG. 10 typical values and components are given, but it will be appreciated that other components and other values may also be used to achieve the same desired result of providing automatic gain control.

Assuming that the carrier frequency is 38.5 KHZ, tuned circuit 22 will be tuned to 38.5 KHZ. Referring to FIG. 10, an emitter follower transistor 31 is connected to tuned circuit 22. Transistor 31 has the characteristics of a high input impedance and a low output impedance. The circuitry is designed so as to provide for maximum gain at all times that there is no received signal. When a strong signal is received there will be a higher DC voltage at point p after rectifier diode 32 as a result of the operation of transistor 31 in conjunction with the other components of the circuit shown in FIG. 10. With a high voltage at point p, transistor 33 turns off and the gain of transistor 34 will be reduced according to the strength of the control pulse. The gain of transistor 34 is applied to voltage gain control integrated circuit 21A which controls the strength of the received signal to be applied to amplifier 21. Once the control pulse turns off, transistor 33 turns on and discharges capacitor C30 so as to provide for maximum gain for the next signal.

DETECTION MEANS

The control pulse is now applied to the detection means so as to convert the selection information inherent in the control pulse to a state in which it may be applied to the television receiver, thereby achieving the desired selection. One preferred means of achieving this detection means is described hereafter and is in the form of logic circuitry.

Figure 13:
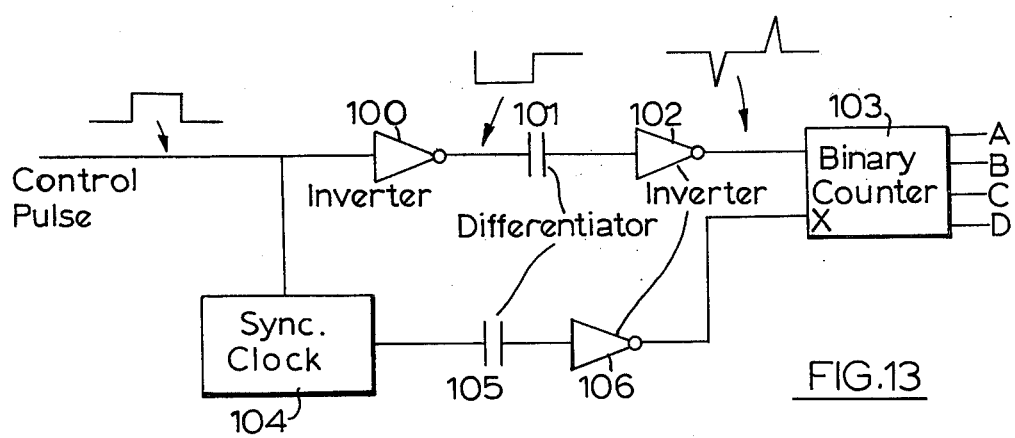
FIG. 13 is a block diagram of the front end of the detection means including a binary counter.

FIG. 13 is a block and schematic diagram which illustrates the circuitry for the front end of the detection means. The relationship of this circuitry to the entire detection means circuitry may be seen by reference to FIG. 11. As shown in FIG. 13, an inverter 100 has its output terminal connected to a differentiator 101, the output terminal of which is connected to an inverter 102 that in turn has its output terminal connected to one input terminal of a binary counter 103. The control pulse is applied to the input terminal of inverter 100. The control pulse is simultaniously applied to a sync clock 104 the output of which is applied to a differentiator 105 having its output terminal connected to an inverter 106. The output of inverter 106 is applied to another input terminal of binary counter 103.

The control pulse from the receiving means is inverted by inverter 100 of FIG. 13, the inverted control pulse is differentiated by differentiator 101 and the differentiated signal is inverted by inverter 102. The input to binary counter 103 from inverter 102 will be a leading edge pulse, i.e. a pulse occurring at the same point in time as the leading edge of the control pulse, which acts as the reset for the binary counter 103. The control pulse also acts as a trigger for the sync clock generator 104 which generates pulses during the time period of the control pulse. The output of clock 104 is differentiated by differentiator 105 and the differentiated signal is inverted by inverter 106. The pulses that are applied to and counted by binary counter 103 from inverter 106 occur at the same point in time as the trailing edges of the sync clock output pulse.

Binary counter 103 has a 4-bit output and there are therefore 16 possible combinations with each particular combination being determined by the number of sync clock pulses which in turn, is determined by the width of the control pulse, as will be more apparent hereinafter.

Each combination of outputs of binary counter 103 corresponds to a particular selection at the transmitting means of FIG. 1. It will be recalled that there were provided at the transmitting means 16 possible selections.

Figure 12:
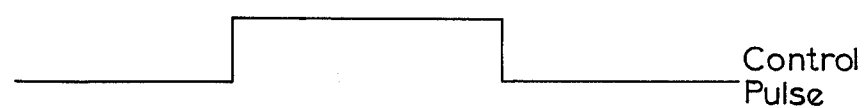
FIG. 12 is a waveform diagram illustrating the relationship of a sync clock pulse and a control pulse used in the practice of this invention.

FIG. 12 illustrates the operation of sync clock 104 in relation to the control pulse received. Sync pulse generator 104 may be a gated, free-running multivibrator with a pulse width of approximately 5.5 milliseconds. The control pulse gates the sync clock on, and it continues to run for a period of time corresponding to the width of the control pulse. Suppose, for example, that the control pulse has a pulse width of 11 ms. In this case the output from the sync clock would be one pulse, and therefore one pulse would be applied to the binary counter 103 from inverter 106. Assuming the sync clock time constant (the time for one complete cycle) is fixed at 11 ms., any control pulse greater than 11 ms. and equal to or less than 22 ms. will result in 2 pulses being applied to the binary counter from inverter 106.

Figure 11A:
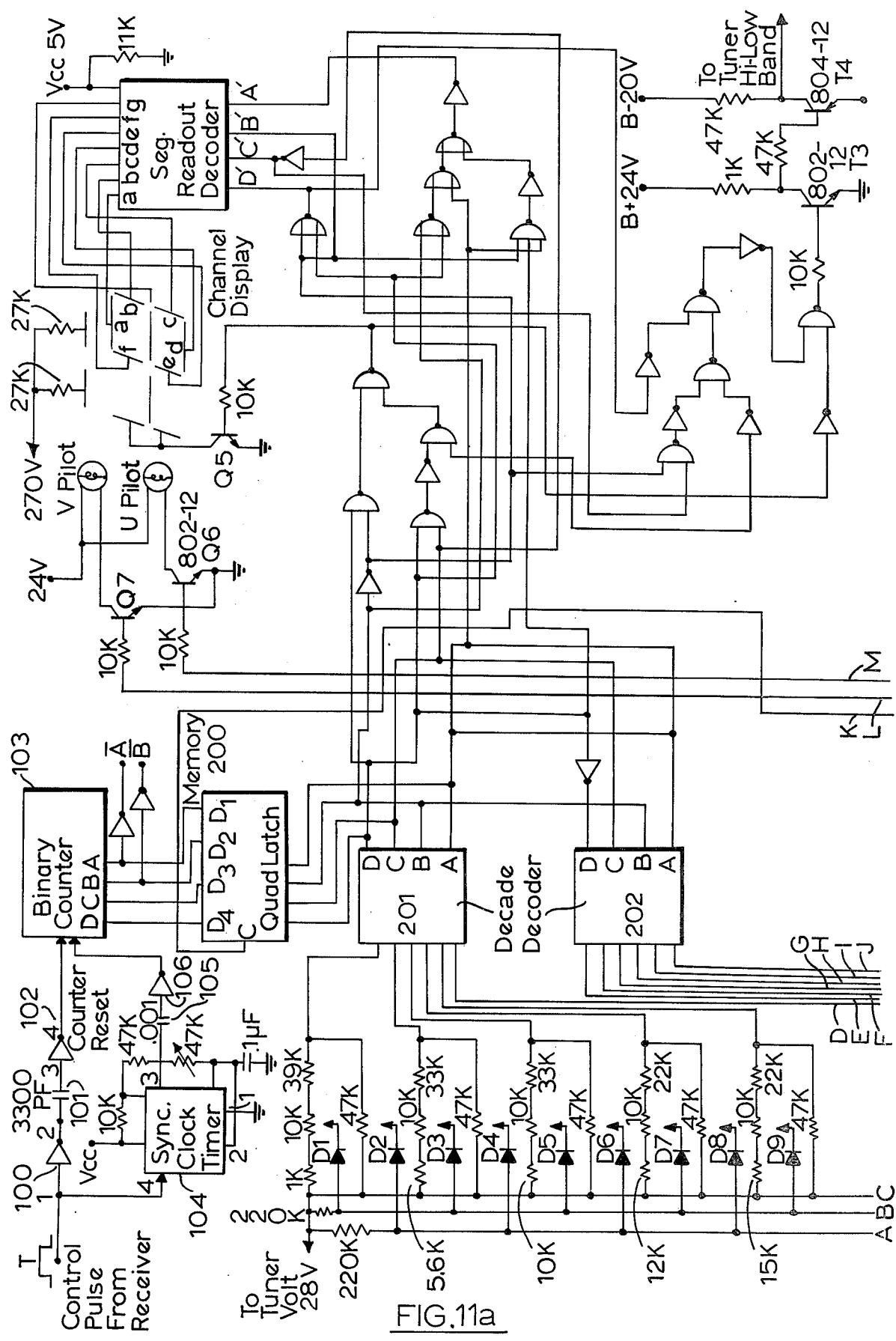
FIGS. 11a and 11b are a schematic and block diagram of a logic control system for the information detection means.
Figure 11B:
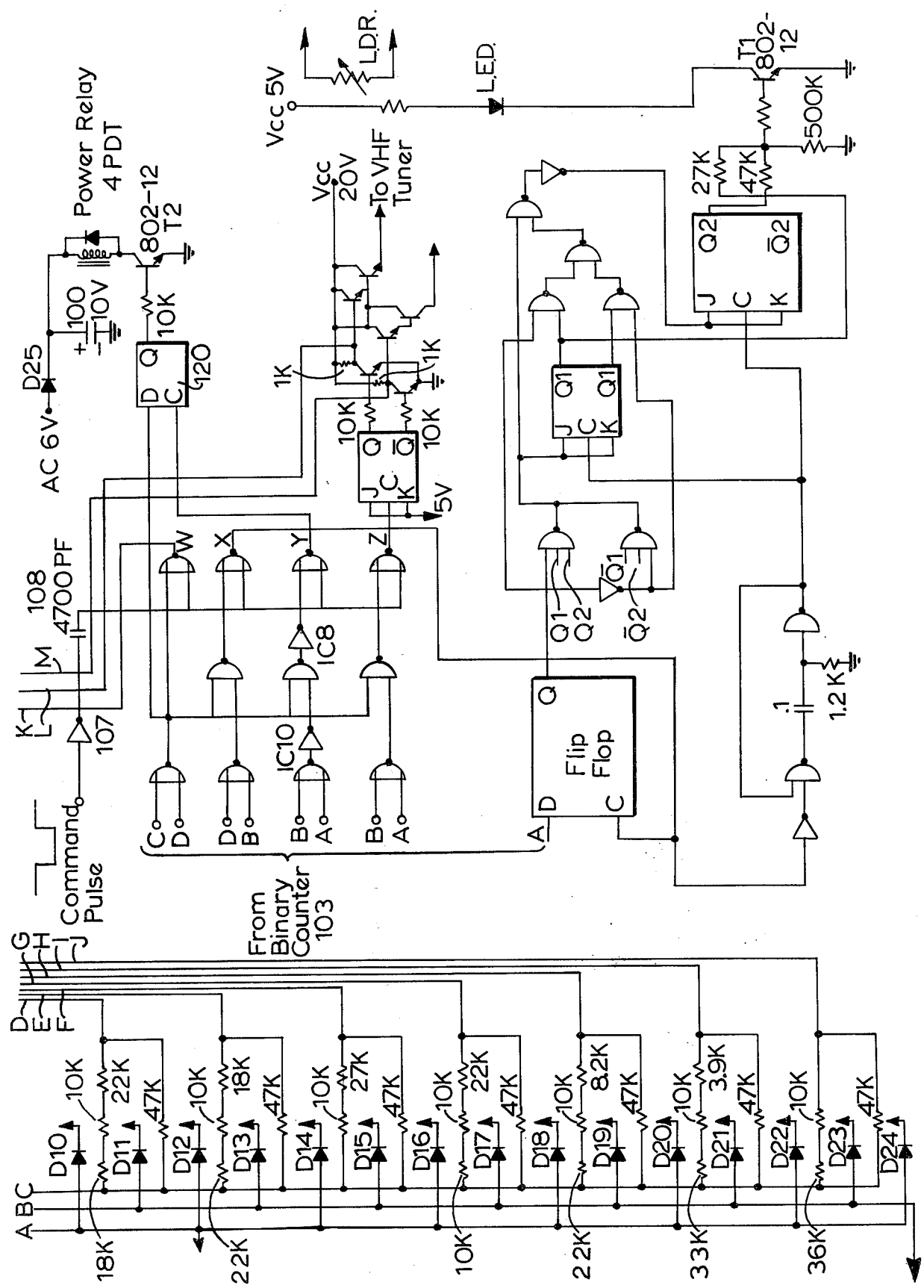
Figures 14, 15, 16:
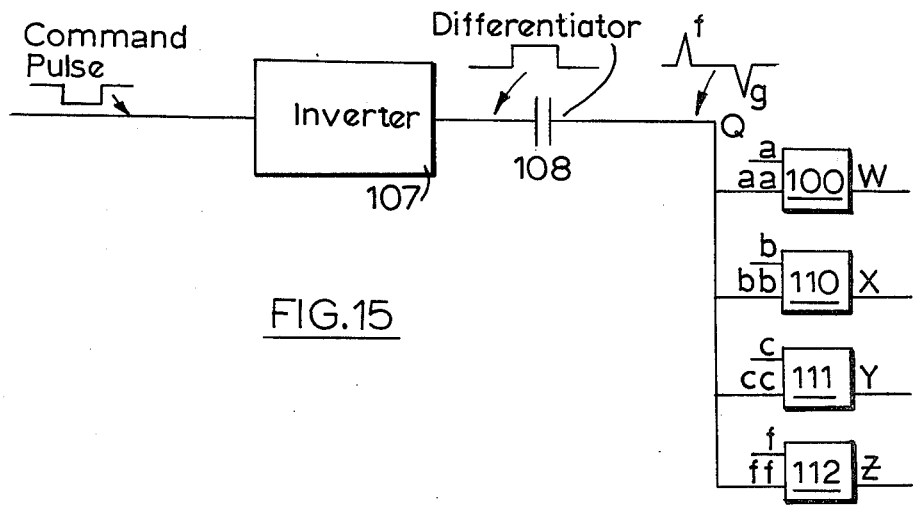
FIG. 14 is a logic truth table designation of a function for each of 16 possible states of a 4 bit logic system.
FIG. 15 is a waveform and block diagram illustrating changes in a command pulse at the detection means.
FIG. 16 is a representation of a Nor Gate and Nand Gate with truth tables.

Considering now the command pulse derived as shown in FIGS. 4 and 8, and referring to FIG. 15, which has been extracted from FIG. 11b for the purposes of clarity of discussion, the command pulse is applied to inverter 107, the inverted command pulse is differentiated by differentiator 108 and the output of differentiator 108 is applied to NOR gates 109, 110, 111 and 112. This particular aspect of the detection means and logic circuitry is illustrated in FIG. 15 which illustrates the transformation of the command pulse waveform by the various components.

The command pulse from the receiving means is in the form of a negative pulse as shown in FIGS. 7 and 15. The negative pulse is inverted by inverter 107 and the inverted command pulse is differentiated by differentiator 108, thereby creating positive and negative pulses f and g occurring in time coincidence with the leading and trailing edges of the command pulse. The positive pulse will in logic circuitry be the ONE state and the negative pulse will be the ZERO state.

The characteristic of a NOR gate is shown in FIG. 16 from which it can be seen that a ONE state output thereof exists only when both inputs are ZERO state.

It can therefore be seen that a ONE state at the outputs W, X, Y and Z of NOR gates 109, 110, 111 and 112 respectively will be derived only when ZERO state pulses are applied to input terminals aa, bb, cc and dd of the NOR gates at the same time as ZERO state pulses are applied to input terminals a, b, c and d of the NOR gates.

At this stage reference may be made to FIG. 14 which designates a function for each of the sixteen possible states. It will then be necessary to devise logic circuitry to detect the various functions which constitute the selection information. The selections may be divided into four different groups as follows: one group is for the twelve channels and on switch, another group is for the sound level, another group for the power off, and the final group for VHF/UHF.

The logic circuitry necessary to interpret the four groups of functions indicated in FIG. 14 may be determined by means of the Karnough Map method. Four separate groups W, X, Y and Z may be designated.

Figure 17:
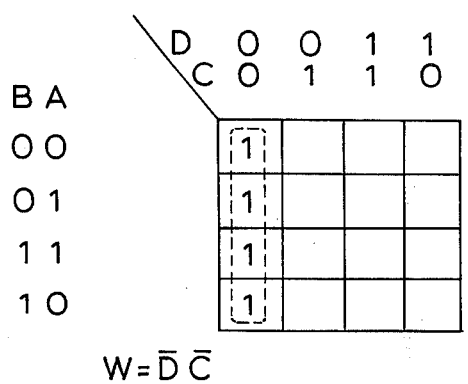
FIG. 17 is a Karnough Map of the Channel and On function.
Figure 17:
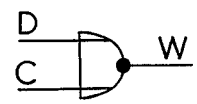

Referring to FIG. 14, it can be seen that the letters D and C representing two of the four bits D, C, B, A, remain in the ZERO state for the clock numbers 16, 1, 2 and 3. All other clock numbers may be grouped as W. This information may be utilized by means of the Karnough Map method to determine a logic circuitry representation for the group designation W. FIG. 17 illustrates the channel and ON switch group designation W Karnough Map and the logic expression derived for this group designation is $W = \overline{DC}$.

Figure 18:
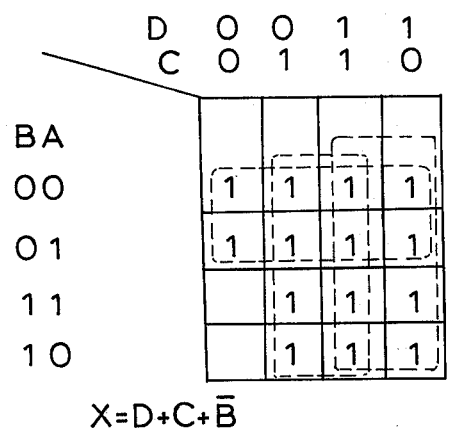
FIG. 18 is a Karnough Map for the sound level function.
Figure 18:
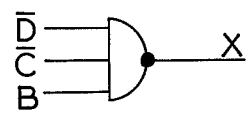

Clock number 2 and 3 of FIG. 14 have bits D, C, and B constantly at 0.0 and 1 respectively. These clocks may be designated as Group X and used for sound level functions. From the Karnough Map method Group designation X may be represented by the expression $X = D + C + \overline{B}$ as shown in FIG. 18.

Figure 19:
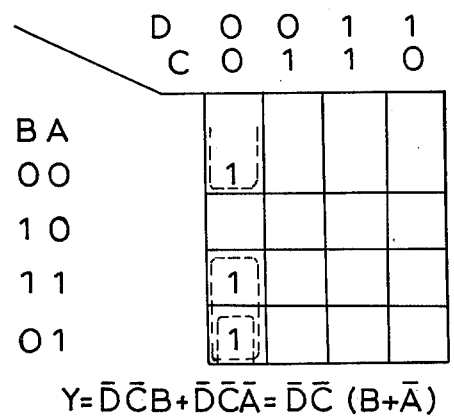
FIG. 19 is a Karnough Map for the Off switch function.
Figure 19:
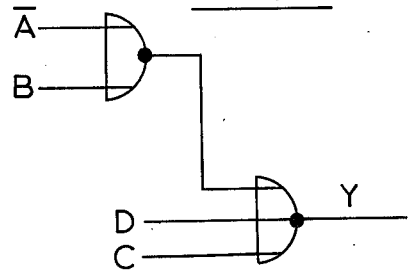

In FIG. 19 Group Y being the designation as the OFF switch is represented in the form of a Karnough Map. In FIG. 14 the Off Function is represented as Group Y comprising clock number 1. From the Karnough Map method it can be determined that $Y = \overline{DC}(B + A)$.

Figure 20:
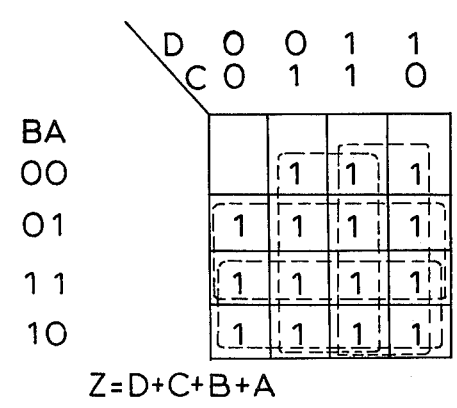
FIG. 20 is a Karnough Map for the VHF/UHF switch function.
Figure 20:
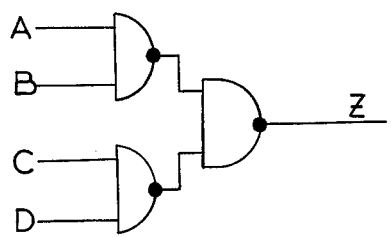

FIG. 20 represents the Karnohugh Map for the VHF/UHF Function. In FIG. 14 this is represented as Group Z, and using the Karnough Map method it can be determined that $Z = D + C + B + \overline{A}$.

Binary algebraic expressions now have been derived for each of the group designations W, X, Y and Z. A logic circuit schematic shown in FIG. 21 can be devised therefrom to achieve the desired detection means as represented by the group designations W, X, Y and Z of FIG. 14 and the binary algebraic expressions derived therefor.

Figure 21:
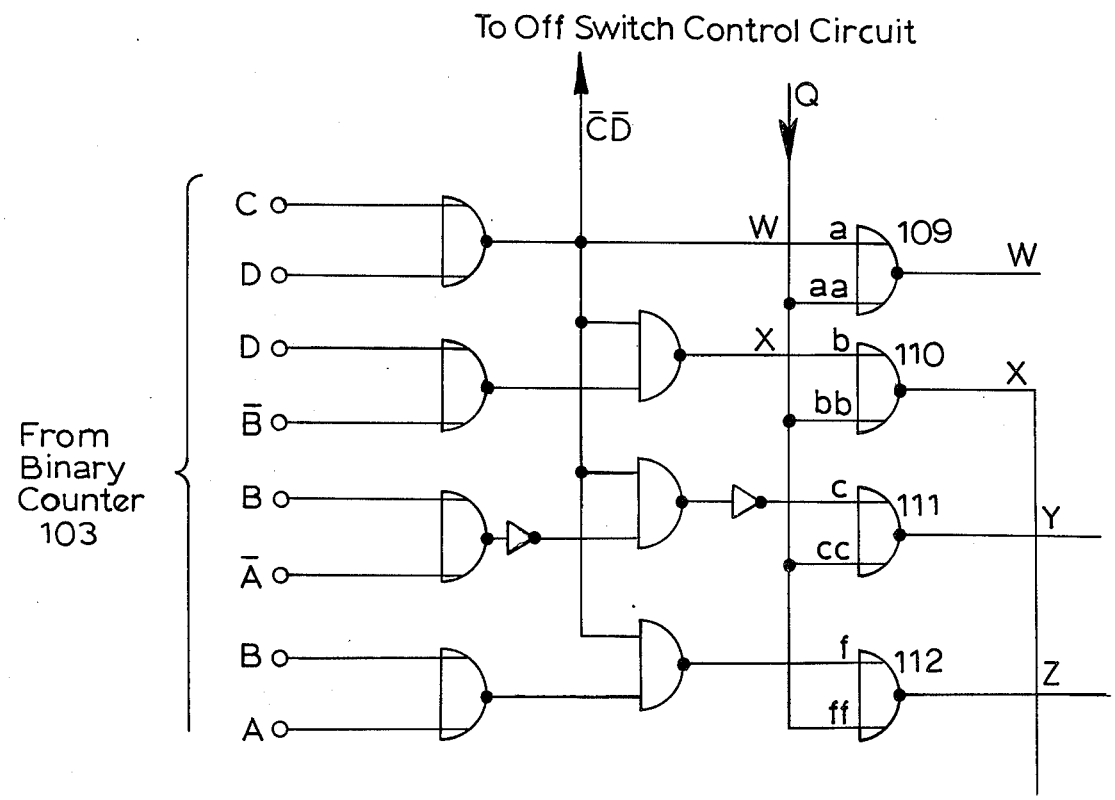
FIG. 21 is a logic schematic of command pulse decoder circuitry.

In FIG. 21 the conductor designated Q corresponds to the output of differentiator 108 in FIG. 15. The conductors A, B, C, and D correspond to the four bit outputs of binary counter 103 (FIG. 13). The output of NOR gate 109 designated as W will be in the ONE state only when both inputs at input terminals a and aa are ZERO state inputs. As has been seen from the discussion of FIG. 15, there will be a ZERO state input at input terminal aa at a point in time corresponding to the trailing edge of the command pulse. The only time there may be a ONE state output therefore is if a command pulse is received. In addition to a ZERO state as a result of a received command pulse, there must be a ZERO state input to NOR Gate 109 at terminal a before a ONE state output will appear at output W. Likewise with respect to the outputs X, Y and Z of NOR Gates 110, 111, and 112, two ZERO inputs are necessary for a ONE state output. Only when the outputs W, X, Y and Z are in the ONE state will circuitry devised to achieved the desired selection be activated. Possible circuitry devised to activate the receiver so as to achieve the desired selection will now be discussed in terms of the four groupings of functions of FIG. 14.

For example, we have derived the expression $W = \overline{DC}$ to represent any of the clock numbers 4 to 15 inclusive of FIG. 14. If clock number 4 were selected, bit D would be at zero state, bit C at 1 state, bit B at 0 state and bit A at 0 state as seen in FIG. 14. The four bits A, B, C and D are the output terminals of Binary Counter 103 of FIG. 13. Hence, when the output terminals of Binary Counter 103 of FIG. 13 are in the same state as clock 4 of FIG. 14, and a command pulse has been received, there will be an output in the 1 state of NOR Gate 109 in FIG. 21. This 1 state output results in channel selection circuitry to be actuated as will be more fully explained hereafter.

Likewise if the states of Binary Counter 103 of FIG. 13 corresponded to another Clock number of FIG. 14, there would be an output of only one of NOR Gates 109, 110, 111, or 112 of FIG. 21 assuming the proper command pulse reception as well.

SOUND LEVEL: GROUP DESIGNATION X

Figure 22:
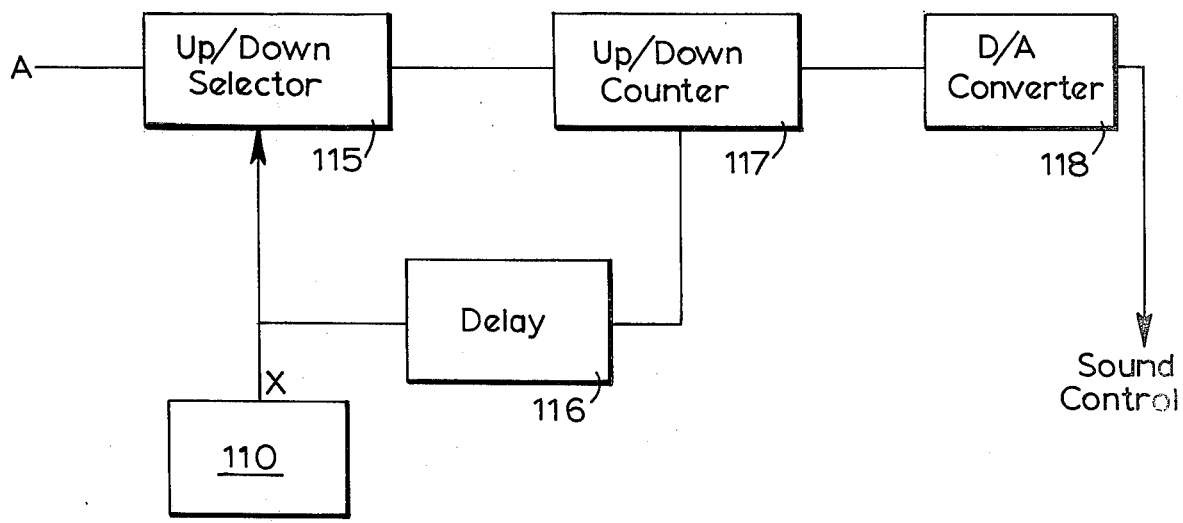
FIG. 22 is a block diagram of a sound level control circuit.

The audio circuit has been designed so as to have four steps in the sound level control. FIG. 22 is a block diagram of a desirable sound level control circuit. The sound level function was designated by the group designation X. In FIG. 21 the output of NOR gate 110 is represented as X. Connected to the output of NOR gate 110 is up-down selector 115 which has an A bit input as well, and, which in turn is connected to up-down counter 117. A delay of the output signal X from NOR Gate 110 is acheived at up-down counter 117 by delay 116 which is connected to up-down counter 117 and acts as a clock to trigger the up-down counter 117. The output of up-down counter 117 is connected to a digital-to-analog converter 118, the output of which controls the sound level by conventional means.

It will be recalled from FIG. 14 that the A bit is the only bit that varies of the 4 bits of clocks 2 and 3. This A bit is one of the outputs Binary Counter 103 of FIG. 13. Suppose clock 2 of FIG. 14 is the Up function then A is in zero state. Hence the A input to Up-Down Selector 115 of FIG. 22 will be zero state and the Up-Down Selector 115 will be set to incease sound level when a trigger X is received from NOR Gate 110.

In the normal sequence a sound level selection would proceed from low to high and the next sequencial step would be directly from the highest selection to the lowest selection. This is an undesirable effect and the present invention provides for logic circuitry which has a built-in stop at the highest sound level selection so as to avoid the undesirable effect. Likewise the logic circuitry provides for a stop at the lowest sound level selections so as to avoid proceeding directly from the lowest to the highest sound level.

Figure 23:
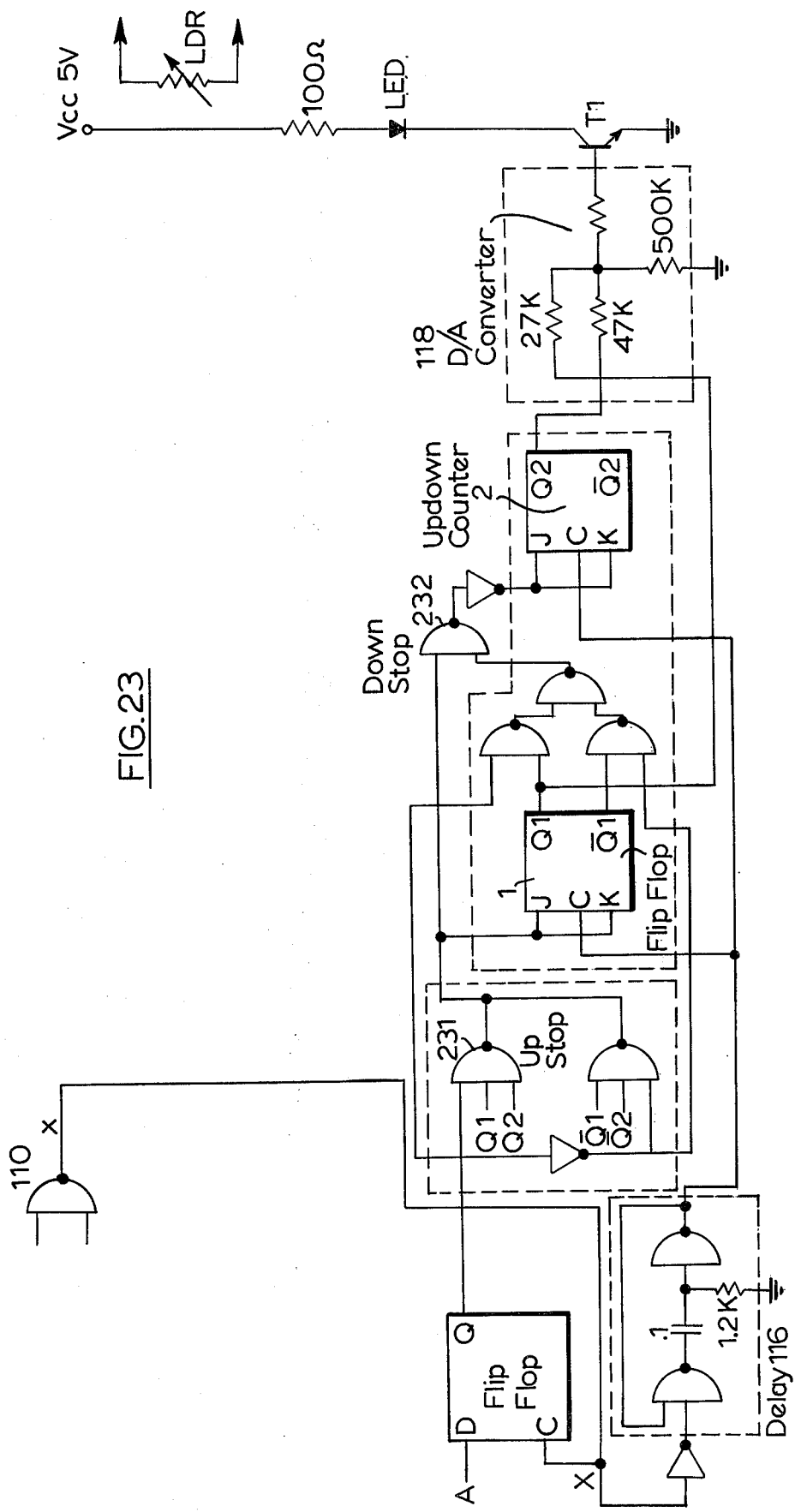
FIG. 23 is a logic schematic diagram with suggested component values for the circuit of FIG. 22.

FIG. 23 is a schematic diagram of the audio control circuit with suggested components indicated. By using the AND Gates 231 and 232 the desired result of blocking the counter at both ends to avoid proceeding from high to low and vice versa is achieved. The delay in the sound level command pulse which was achieved by delay 116 in FIG. 22 is necessary in order to permit the up or down function input to arrive before the clock counter is activated. The digital/analog converter 118 is used to convert the digital signal into equivalent analog voltage. The anolog output voltage is then fed through a transistor T18 and by conventional means achieves the sound control. In this particular schematic representation the sound control of the analog output is seen to be achieved by an LED-LDR combination circuitry (light emitter diode-light dependant resistor). It will be appreciated that although circuit components and values are given in FIG. 23 in order to achieve the desired result, other circuit components and values would likewise be available to achieve the same result.

OFF, SWITCH CONTROL: GROUP DESIGNATION Y

Figure 24:
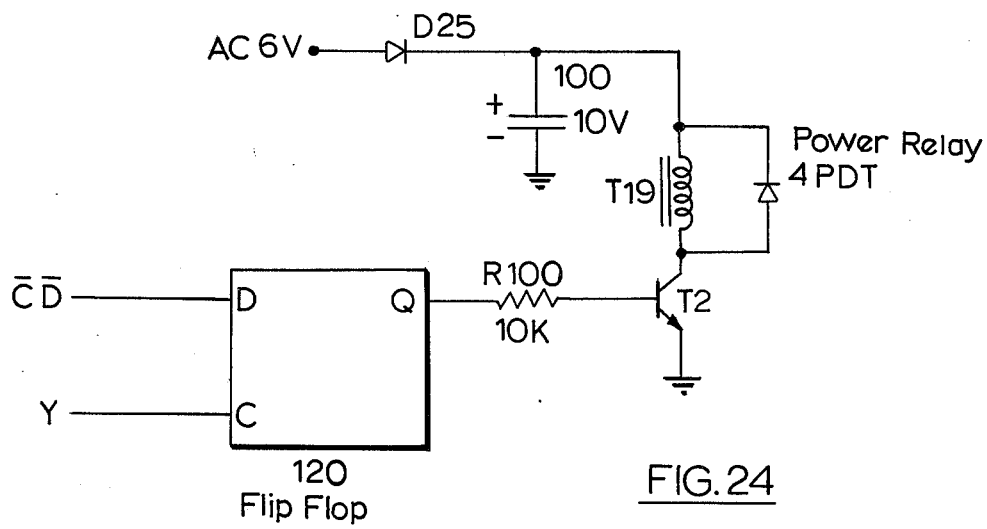
FIG. 24 is a schematic diagram of an ON-OFF Switch Control with suggested component values.

We represented the off switch function as group designation Y in FIG. 14. In FIG. 21 the output of NOR gate 111 is represented as Y. We may achieve the desired off switch control by means of logic circuitry as shown in in FIG. 24. FIG. 24 illustrates a Flip Flop 120 connected by means of a base resistor R100 to transistor T-19. The transistor T-19 in turn is connected to a power relay 4PDT which will turn off the power when activated.

The input of the D type Flip Flop 120 is connected to binary signal represented by $\overline{CD}$ which as seen from FIG. 21 may be taken from the logic circuit devised for the group designation W, X, Y and Z. The OFF signal Y goes to the Flip Flop 120 input at C and the output at Q of Flip Flop 120 when at the ONE state renders the television set or other device in the OFF state. As we have seen, the circuitry is designed so that the set may be turned on by operating any one of the channel selections. When any one of the channel selection buttons are depressed $\overline{CD}$ signal causes the output at Q to change to the zero state and which will remain in that state until such time as an off signal Y arrives at input C of Flip Flop 120. In the particular schematic circuitry shown in FIG. 24 a transistor T19 has been used to drive a DC relay 4PDT to turn on and to turn off the power. It will be appreciated that althrough specific components and values are given in FIG. 24 other components may be used to achieve the desired control.

UHF/VHF SWITCH CONTROL: GROUP DESIGNATION Z

Figure 25:
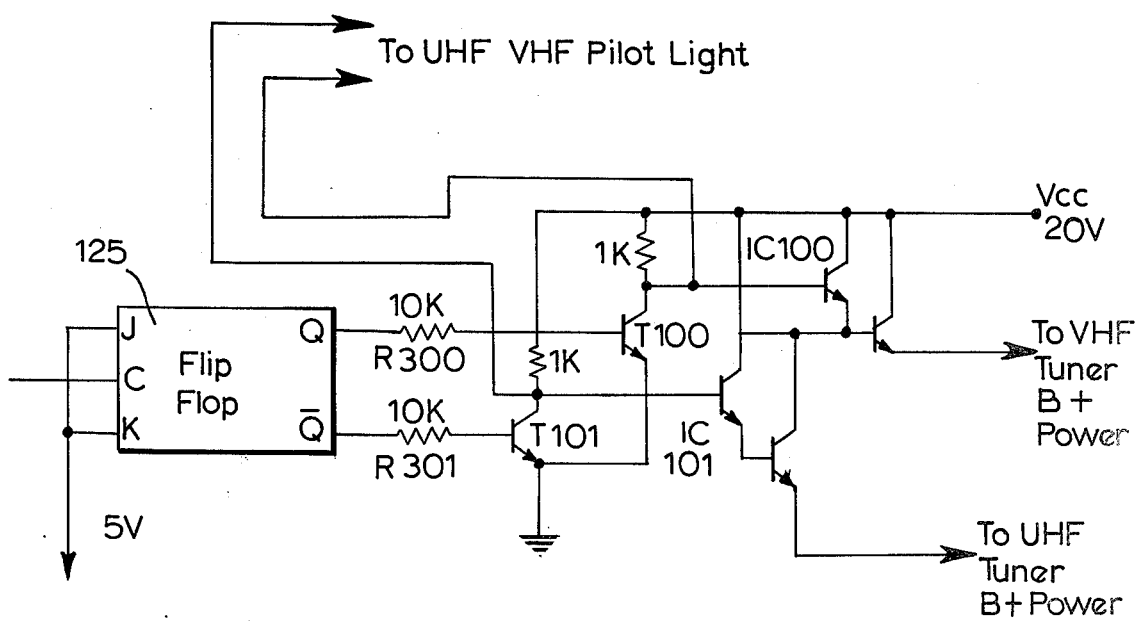
FIG. 25 is a schematic diagram of a VHF/UHF Switch Control with suggested component values.

In FIG. 14 we represented the UHF/VHF function as group designation Z. In FIG. 21 the output of NOR gate 112 is represented as Z which is the control signal for UHF/VHF. FIG. 25 is a schematic diagram illustrating possible circuit components and values in order to achieve the desired UHF/VHF control. The circuitry consists of a Flip Flop 125 connected by base resistors R300 and R301 to transistor T100 and T101 which in turn are connected to Darlington integrated circuits IC100 and IC101 used for switching VHF and UHF tuners.

The VHF/UHF control signal Z is applied at input C to J-K Flip Flop 125. In the J-K Flip Flop 125 inputs J and K are both inter-connected and are at the ONE state. The output Q will change from the ZERO to the ONE state and from the ONE state to the Zero state for each input signal at input C. Outputs Q and $\overline{Q}$ are connected to the bases of transistors T100 and T101 by means of resistors R300 and R301 which in turn drive two Darlington integrated circuits for switching VHF or UHF tuners and at the same time pilot lamps (not shown) are activated to indicate VHF or UHF selection. When $\overline{Q}$ is of the ONE state the VHF tuner will be activated. When Q is at the ONE state the UHF tuner will be activated. Since all bits A, B, C and D of FIG. 14 are always at the ZERO state, whenever clock 16 is activated at the selection means, assuming the proper command pulse is received by the detection means, there will be a ONE state output Z of NOR Gate 112 of FIG. 21. Each time a ONE state is received at flip flop 125 the receiver will switch from UHF to VHF or vice versa. Although circuit components and values are given in FIG. 25 it should be appreciated that other circuit components and values may be likewise utilized in order to achieve the desired control.

CHANNEL SELECTION: GROUP DESIGNATION W

In FIG. 14 the ON switch and 12 channel selection functions were designated by group designation W. In FIG. 21 the channel selection control signal appearing at the output of NOR gate 109 is represented as W. The entire channel selection circuitry is shown in FIGS. 11a and 11b, representative values for the various components being given in FIGS. 11a and 11b. It is not necessary to describe in detail the channel selection circuitry, since this circuitry is known, but nevertheless the circuitry has been shown in FIGS. 11a and 11b to complete the logic circuitry of the remote control system detection means.

Signal W output from NOR Gate 109 is connected as an input to memory 200 in FIGS. 11a. The 4 bit output A, B, C and D of binary counter 103 is input to memory 200. The actual binary combination of four bit binary signal A, B, C and D is dependent on the pulse width of the control pulse which is applied to sync clock 104. The output of memory 200 is connected to decade decoders 201 and 202. The twelve outputs of the decade decoders 201 and 202 represent the twelve selection channels and by conventional means the outputs of the decade decoders 201 and 202 provide for tuning of the receiver so that the particular output of the decade decoders 201 and 202 tunes the channel selected at the transmitting means.

An important feature of this system is that it is not necessary to move in sequence from one channel to another in order to achieve the channel selection information transmitted. The input to the binary counter 103 from inverter 102 of FIG. 13 is, as we have seen, a leading edge pulse derived from the control pulse received by the receiving means. This leading edge pulse will reset the binary counter for each signal. Whenever channel selection information is transmitted, the television receiver will automatically go to the channel selected and the transient time will not be discernible by the human eye viewing the television screen.

The complete circuitry is shown in FIGS. 11a and 11b. The circuitry need not be described further since it is known circuitry but is illustrated in FIGS. 11a and 11b for the purpose of clarity and completion. It will be appreciated that the components and values given to illustrate and explain the detection means, receiving means and transmitting means are only representative and other components and values may be substituted without departing from the spirit of the invention as described herein.

The embodiments of the invention in which an exclusive property or privilege is claimed are defined as follows:

1. In combination, signal receiving equipment adapted to receive and translate broadcast signals, said signal receiving equipment including information receiving and detecting means, said signal receiving equipment being operable in a plurality of different modes; a transmitter remotely located with respect to said signal receiving equipment, said transmitter including means for generating pulses having different discrete pulse widths, each pulse having a leading edge and a trailing edge, each pulse width corresponding to a different desired mode of operation of said signal receiving equipment, and means for transmitting said pulses; said information receiving and detecting means comprising means for receiving and detecting said pulses, trailing edge noise eliminating means and means for applying said received and detected pulses to said trailing edge noise eliminating means for eliminating noise pulses that may follow the trailing edges of the received and detected pulses; and means for controlling the mode of operation of said signal receiving equipment comprising means responsive to detection of pulses having different discrete pulse widths for automatically changing the mode of operation of said signal receiving equipment to modes of operation that are predetermined by the widths of said pulses detected by said detecting means.

2. The combination according to claim 1 wherein said signal receiving equipment is a television receiver, said plurality of modes being different channels to which said receiver may be tuned.

3. The combination according to claim 2 wherein said plurality of modes also include on-off, different sound levels and VHF-UHF.

4. The combination according to claim 1 wherein said pulses transmitted by said transmitter are transmitted as the envelope of a single carrier frequency.

5. The combination according to claim 1 wherein said detecting means includes a clock pulse generator, means for turning on said clock pulse generator for the duration of a detected pulse and means for counting the pulse output of said clock pulse generator.

6. The combination according to claim 5 wherein said pulses transmitted by said transmitter are transmitted as the envelope of a single carrier frequency.

7. The combination according to claim 1 wherein said information receiving and detecting means includes means for generating from a received and detected pulse a control signal responsive to reception of an information-containing pulse transmitted by said transmitter, said generating means being unresponsive to spurious noise pulses of shorter duration than said information-containing pulse transmitted by said transmitter, and means responsive to the absence of said control signal for inhibiting any automatic change in the mode of operation of said signal receiving equipment.

* * * * *